US012322662B2

(12) United States Patent
Wong et al.

(10) Patent No.: US 12,322,662 B2
(45) Date of Patent: Jun. 3, 2025

(54) DISPLACEMENT MEASUREMENTS IN SEMICONDUCTOR WAFER PROCESSING

(71) Applicant: Applied Materials, Inc., Santa Clara, CA (US)

(72) Inventors: Justin Wong, Concord, CA (US); Ehud Chatow, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 765 days.

(21) Appl. No.: 17/334,407

(22) Filed: May 28, 2021

(65) Prior Publication Data

US 2022/0384278 A1    Dec. 1, 2022

(51) Int. Cl.
*H01L 21/66*    (2006.01)
*B24B 37/005*    (2012.01)
(Continued)

(52) U.S. Cl.
CPC ............ *H01L 22/20* (2013.01); *B24B 37/005* (2013.01); *H01L 21/02057* (2013.01); *H01L 21/3212* (2013.01); *H01L 21/67046* (2013.01); *H01L 21/67253* (2013.01); *H01L 21/67259* (2013.01); *H01L 21/67288* (2013.01)

(58) Field of Classification Search
CPC .............. B24B 37/005; H01L 21/3212; H01L 21/67288; H01L 21/67259; H01L 21/67253
See application file for complete search history.

(56) References Cited

U.S. PATENT DOCUMENTS 6,930,782 B1 *   8/2005  Yi .............................. G06T 7/70
                                                            356/504
2009/0093192 A1 *   4/2009  Takahashi ............... B24B 9/065
                                                            451/6
(Continued)

FOREIGN PATENT DOCUMENTS

CN          101164148 A     4/2008
CN          208681336 U     4/2019
(Continued)

OTHER PUBLICATIONS

English translation of KR 2018-0129088. Obtained from Espacenet on Jun. 14, 2024. (Year: 2024).*
(Continued)

*Primary Examiner* — Michael A Lyons
(74) *Attorney, Agent, or Firm* — Kilpatrick Townsend & Stockton LLP

(57) ABSTRACT

Wafers that begin as flat surfaces during a semiconductor manufacturing process may become warped or bowed as layers and features are added to an underlying substrate. This warpage may be detected between manufacturing processes by rotating the wafer adjacent to a displacement sensor. The displacement sensor may generate displacement data relative to a baseline measurement to identify areas of the wafer that bow up or down. The displacement data may then be mapped to locations on the wafer relative to an alignment feature. This mapping may then be used to adjust parameters in subsequent semiconductor processes, including adjusting how a carrier head on a polishing process holds or applies pressure to the wafer as it is polished.

18 Claims, 10 Drawing Sheets

(51) Int. Cl.
  *H01L 21/02*    (2006.01)
  *H01L 21/321*   (2006.01)
  *H01L 21/67*    (2006.01)

(56) References Cited

U.S. PATENT DOCUMENTS

| | | |
|---|---|---|
| 2014/0078495 A1 | 3/2014 | Zhang |
| 2014/0080229 A1 | 3/2014 | Zhang |
| 2016/0268173 A1 | 9/2016 | Broadway |
| 2023/0178387 A1* | 6/2023 | Park .................. H01L 21/67051 |
| | | 15/301 |
| 2023/0238266 A1* | 7/2023 | Schulze .............. H01L 21/6831 |
| | | 356/601 |

FOREIGN PATENT DOCUMENTS

| | | |
|---|---|---|
| JP | 2006-303112 A | 11/2006 |
| JP | 4380791 B2 | 12/2009 |
| KR | 10-2017-0000067 A | 1/2017 |
| KR | 10-2018-0129088 A | 12/2018 |

OTHER PUBLICATIONS

Application No. PCT/US2023/020174, International Search Report and Written Opinion, Mailed On Aug. 16, 2023, 10 pages.
International Search Report and Written Opinion mailed on Sep. 13, 2022 in International Patent Application No. PCT/US2022/030791, 11 pages.

* cited by examiner

DISPLACEMENT MEASUREMENTS IN SEMICONDUCTOR WAFER PROCESSING

TECHNICAL FIELD

This disclosure generally relates to measuring warpage of a wafer between semiconductor manufacturing processes. Specifically, this disclosure describes measuring displacement data around a wafer to characterize a warp/bow in the wafer, then using the displacement data to control subsequent processes to compensate for the warp/bow.

BACKGROUND

An integrated circuit is typically formed on a substrate by the sequential deposition of conductive, semiconductive, and/or insulative layers on a silicon wafer. A variety of fabrication processes use the planarization of a layer on the substrate between processing steps. For example, for certain applications, e.g., polishing of a metal layer to form vias, plugs, and/or lines in the trenches of a patterned layer, an overlying layer is planarized until the top surface of a patterned layer is exposed. In other applications, e.g., planarization of a dielectric layer for photolithography, an overlying layer is polished until a desired thickness remains over the underlying layer.

Chemical mechanical polishing (CMP) is one common method of planarization. This planarization method typically requires that the substrate be mounted on a carrier or polishing head. The exposed surface of the substrate is typically placed against a rotating polishing pad. The carrier head provides a controllable load on the substrate to push it against the polishing pad. Abrasive polishing slurry is typically supplied to the surface of the polishing pad.

One problem in CMP and other semiconductor processes is maintaining a consistent surface on the wafer. Even though the wafer may begin as a silicon crystal that is relatively flat, various semiconductor processes may deposit, grow, add, etch, remove, and/or otherwise place layers or features on the wafer. These additional layers and features may build up and cause stresses to occur in the wafer. The stresses may then cause the wafer to bow or warp. This warpage may cause problems when polishing or cleaning the surface of the wafer the surface of the wafer may no longer be uniform.

SUMMARY

In some embodiments, a system may include a platform configured to support a wafer and rotate a wafer around a center of the wafer; and one or more displacement sensors positioned to measure a displacement of the wafer as the wafer is rotated.

In some embodiments, a method of measuring displacement of wafers between semiconductor manufacturing processes may include rotating a wafer around a center of the wafer; measuring a displacement of the wafer at a predetermined distance from the center of the wafer as the wafer is rotated to generate displacement data; and using the displacement data to control a polishing process or a cleaning process performed on the wafer.

In some embodiments, a non-transitory computer-readable medium may include instructions that, when executed by one or more processors, cause the one or more processors to perform operations including receiving, for a wafer, displacement data generated using a displacement sensor, where the displacement data may indicate an area on the wafer that is bowed or warped; identifying a parameter of a carrier head corresponding to a location of the area on the wafer that is bowed or warped, where the carrier head may be part of a chemical-mechanical polishing (CMP) machine or a wafer cleaning machine; and adjusting the parameter of the carrier head to compensate for the area on the wafer that is bowed or warped during a cleaning or polishing process.

In any embodiments, any and all of the following features may be implemented in any combination and without limitation. The system may also include an alignment sensor positioned to detect a notch in the wafer as the wafer is rotated. The one or more displacement sensors may include a laser displacement sensor; and the alignment sensor may include a through-beam sensor. The one or more displacement sensors may also be positioned to detect a notch in the wafer as the wafer is rotated. The one or more displacement sensors may include a displacement sensor positioned above the wafer. The one or more displacement sensors may include a displacement sensor positioned below the wafer. The one or more displacement sensors may include a plurality of displacement sensors positioned along a radial line of the wafer. The one or more displacement sensors may include a plurality of displacement sensors positioned at different rotational angles around the wafer. The method/operations may also include measuring a displacement of a baseline wafer to generate baseline displacement data representing a flat wafer surface. Generating the displacement data may include determining a displacement of the wafer relative to the baseline displacement data. The method/operations may also include mapping the displacement data to two-dimensional coordinates on the wafer based on alignment data. The method/operations may also include mapping the displacement data to angles of rotation on the wafer based on alignment data. The method/operations may also include identifying a displacement area on the wafer in the displacement data, and providing the displacement area to the polishing process or the cleaning process. Adjusting the parameter of the carrier head may include adjusting an angle at which the carrier head grips the wafer during the cleaning or polishing process. Adjusting the parameter of the carrier head may include adjusting an amount of pressure provided against the area on the wafer that is bowed or warped during the cleaning or polishing process. Adjusting the amount of pressure may include identifying a chamber in the carrier head that is adjacent to the area on the wafer that is bowed or warped; and adjusting a pressure in the chamber to compensate for the area on the wafer that is bowed or warped. Adjusting the amount of pressure may include adjusting a pressure with which a brush cleans the area on the wafer that is bowed or warped during the cleaning process. The displacement data may be generated using the displacement sensor by rotating the displacement sensor around the wafer.

BRIEF DESCRIPTION OF THE DRAWINGSA

A further understanding of the nature and advantages of various embodiments may be realized by reference to the remaining portions of the specification and the drawings, wherein like reference numerals are used throughout the several drawings to refer to similar components. In some instances, a sub-label is associated with a reference numeral to denote one of multiple similar components. When reference is made to a reference numeral without specification to an existing sub-label, it is intended to refer to all such multiple similar components.

DETAILED DESCRIPTION

Figure 1:
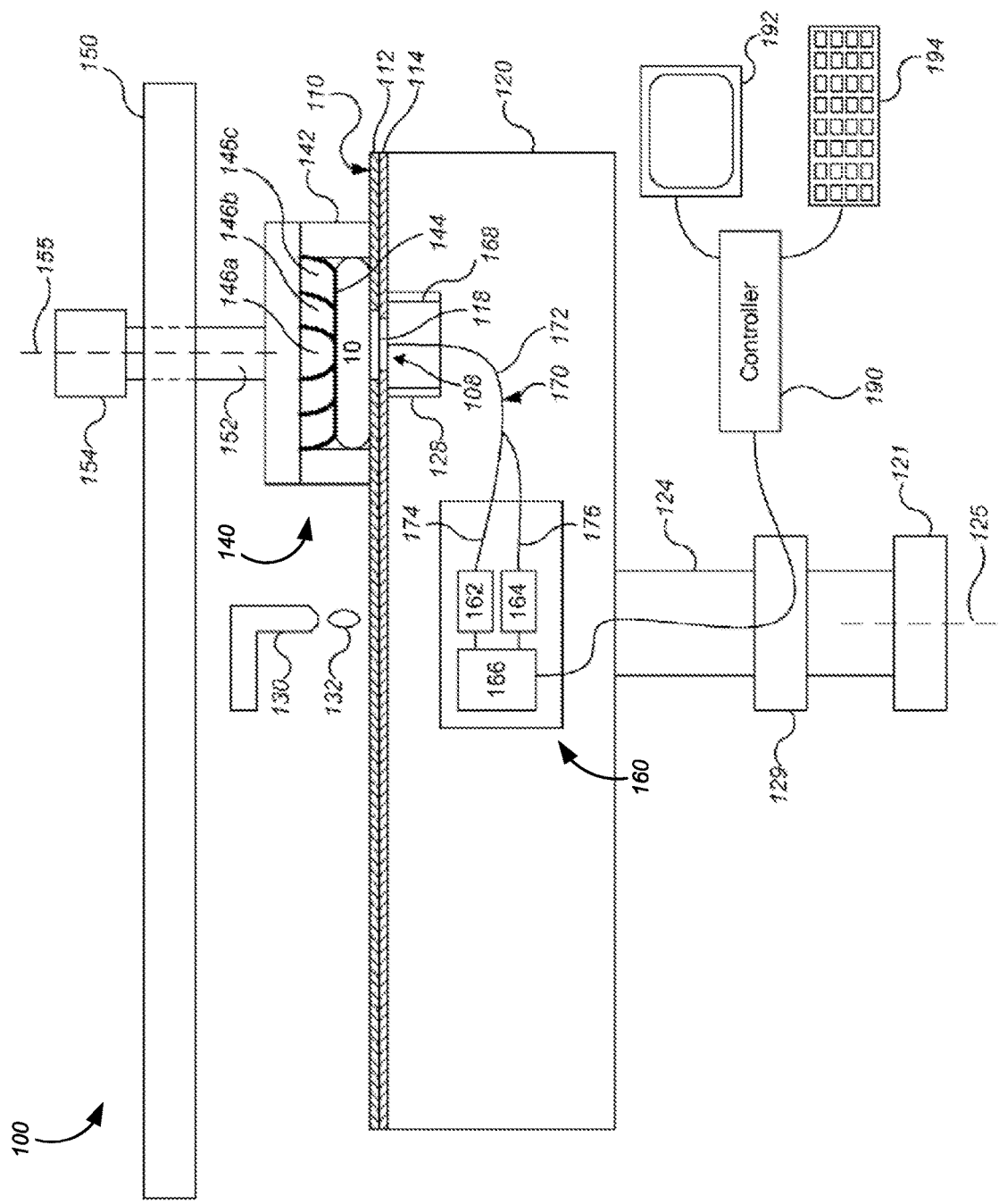
FIG. 1 illustrates a schematic cross-sectional view of an example of a polishing apparatus, according to some embodiments.

FIG. 1 illustrates an example of a polishing apparatus 100. The polishing apparatus 100 may include a rotatable disk-shaped platen 120 on which a polishing pad 110 may be situated. The platen may be operable to rotate about an axis 125. For example, a motor 121 may turn a drive shaft 124 to rotate the platen 120. The polishing pad 110 may be a two-layer polishing pad with an outer polishing layer 112 and a softer backing layer 114.

The polishing apparatus 100 may include a port 130 to dispense polishing liquid 132, such as slurry, onto the polishing pad 110. The polishing apparatus may also include a polishing pad conditioner to abrade the polishing pad 110 to maintain the polishing pad 110 in a consistent abrasive state.

The polishing apparatus 100 may include at least one carrier head 140. The carrier head 140 may be operable to hold a substrate 10 against the polishing pad 110. The carrier head 140 may have independent control of the polishing parameters, for example pressure, associated with each respective substrate.

In particular, the carrier head 140 may include a retaining ring 142 to retain the substrate 10 below a flexible membrane 144. The carrier head 140 may also include a plurality of independently controllable pressurizable chambers defined by the membrane, e.g., three chambers 146a-146c, which may apply independently controllable pressures to associated zones on the flexible membrane 144 and thus on the substrate 10. Although only three chambers are illustrated in FIG. 1 for ease of illustration, there could be one or two chambers, or four or more chambers, e.g., five chambers in other embodiments.

The carrier head 140 may be suspended from a support structure 150, e.g., a carousel or a track, and may be connected by a drive shaft 152 to a carrier head rotation motor 154 so that the carrier head can rotate about an axis 155. Optionally the carrier head 140 may oscillate laterally, e.g., on sliders on the carousel 150 or track; or by rotational oscillation of the carousel itself. In operation, the platen may be rotated about its central axis 125, and the carrier head may be rotated about its central axis 155 and/or translated laterally across the top surface of the polishing pad.

While only one carrier head 140 is shown, more carrier heads may be provided to hold additional substrates so that the surface area of polishing pad 110 may be used efficiently.

The polishing apparatus may also include an in-situ monitoring system 160. The in-situ monitoring system may generate a time-varying sequence of values that depend on the thickness of a layer on the substrate. The in-situ-monitoring system 160 may include an optical monitoring system. In particular, the in-situ-monitoring system 160 may measure a sequence of spectra of light reflected from a substrate during polishing.

An optical access 108 through the polishing pad may be provided by including an aperture (i.e., a hole that runs through the pad) or a solid window 118. The solid window 118 may be secured to the polishing pad 110, e.g., as a plug that fills an aperture in the polishing pad. The solid window may alternatively be molded to or adhesively secured to the polishing pad, although in some implementations the solid window can be supported on the platen 120 and project into an aperture in the polishing pad.

The optical monitoring system 160 may include a light source 162, a light detector 164, and circuitry 166 for sending and receiving signals between a remote controller 190, e.g., a computer, and the light source 162 and light detector 164. One or more optical fibers can be used to transmit the light from the light source 162 to the optical access in the polishing pad, and to transmit light reflected from the substrate 10 to the detector 164. For example, a bifurcated optical fiber 170 may be used to transmit the light from the light source 162 to the substrate 10 and back to the detector 164. The bifurcated optical fiber may include a trunk 172 positioned in proximity to the optical access, and two branches 174 and 176 connected to the light source 162 and detector 164, respectively.

In some implementations, the top surface of the platen can include a recess 128 into which is fit an optical head 168 that holds one end of the trunk 172 of the bifurcated fiber. The optical head 168 may include a mechanism to adjust the vertical distance between the top of the trunk 172 and the solid window 118.

The output of the circuitry 166 may be a digital electronic signal that passes through a rotary coupler 129, e.g., a slip ring, in the drive shaft 124 to the controller 190 for the optical monitoring system. Similarly, the light source may be turned on or off in response to control commands in digital electronic signals that pass from the controller 190 through the rotary coupler 129 to the optical monitoring system 160. Alternatively, the circuitry 166 may communicate with the controller 190 by a wireless signal.

Figure 2:
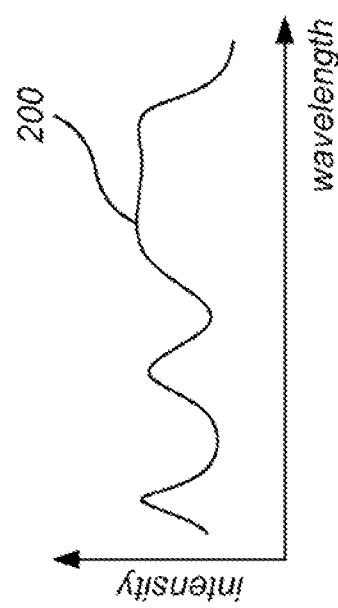
FIG. 2 illustrates a measured spectrum from the in-situ optical monitoring system, according to some embodiments.

The light source 162 may be operable to emit ultraviolet (UV), visible light, or near-infrared (NIR) light. The light detector 164 may be a spectrometer. A spectrometer is an optical instrument for measuring intensity of light over a portion of the electromagnetic spectrum. For example, a grating spectrometer may be used. Typical outputs for a spectrometer may include the intensity of the light as a function of wavelength (or frequency). FIG. 2 illustrates an example of a measured spectrum 200 with intensity as a function of wavelength.

As noted above, the light source 162 and light detector 164 may be connected to a computing device, e.g., the controller 190, operable to control their operation and receive their signals. The computing device may include a microprocessor situated near the polishing apparatus. For example, the computing device may be a programmable computer. With respect to control, the computing device may, for example, synchronize activation of the light source with the rotation of the platen 120. A display 192, e.g., an LED screen, and a user input device 194, e.g., a keyboard and/or a mouse, may be connected to the controller 190.

In operation, the controller 190 may receive, for example, a signal that carries information describing a spectrum of the light received by the light detector for a particular flash of the light source or time frame of the detector. Thus, this spectrum may be a spectrum measured in-situ during polishing. Without being limited to any particular theory, the spectrum of light reflected from the substrate 10 may evolve as polishing progresses due to changes in the thickness of the outermost layer, thus yielding a sequence of time-varying spectra.

Figure 3:
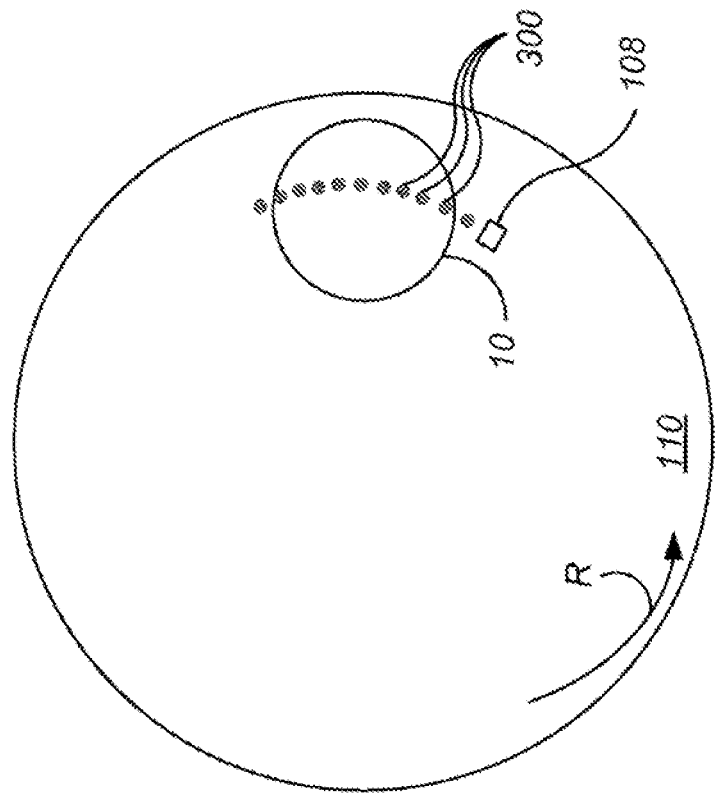
FIG. 3 illustrates a path of a sequence of spectral measurements on the substrate, according to some embodiments.

The optical monitoring system 160 may be configured to generate a sequence of measured spectra at a measurement frequency, or "spectral data." The relative motion between the substrate 10 and the optical access 108 causes spectra in the sequence to be measured at different positions on the substrate 10. In some implementations, the light beam generated by the light source 162 may emerge from a point that rotates (shown by arrow R in FIG. 3) with the platen 120. As shown in FIG. 3, in such an implementation, the relative motion between the substrate 10 and the optical access 108 can cause spectra to be measured at positions 300 in a path across the substrate 10. In some implementations only one spectrum is measured per rotation of the platen. In addition, in some implementations, the emitting point of the light beam is stationary and measurements are taken only when the optical access 108 aligns with the light beam.

A CMP process represents one of many different processes that may be carried out during the manufacture of a semiconductor wafer. As different layers and features are added to the substrate, the CMP process may be used to planarize the wafer and remove specific amounts of material between stages. Ideally, the wafer may begin as a silicon crystal substrate that is completely flat. However, as layers and features are added to the substrate, this additional material adds stress to the structure and may cause warpage or bowing in the wafer. This warpage may cause problems during the CMP process, as the wafer may be polished unevenly, resulting in layers that do not have a uniform thickness after the CMP process is complete.

The embodiments described herein solve these and other technical problems by characterizing a vertical displacement of the wafer between semiconductor manufacturing processes. A displacement measurement may be made around a circumference of the wafer using a displacement sensor. The resulting displacement data may then be used to control a polishing process, a cleaning process, and/or an angle or orientation at which the wafer is handled. This allows a subsequent semiconductor process to compensate for the warpage of the wafer.

Figure 4:
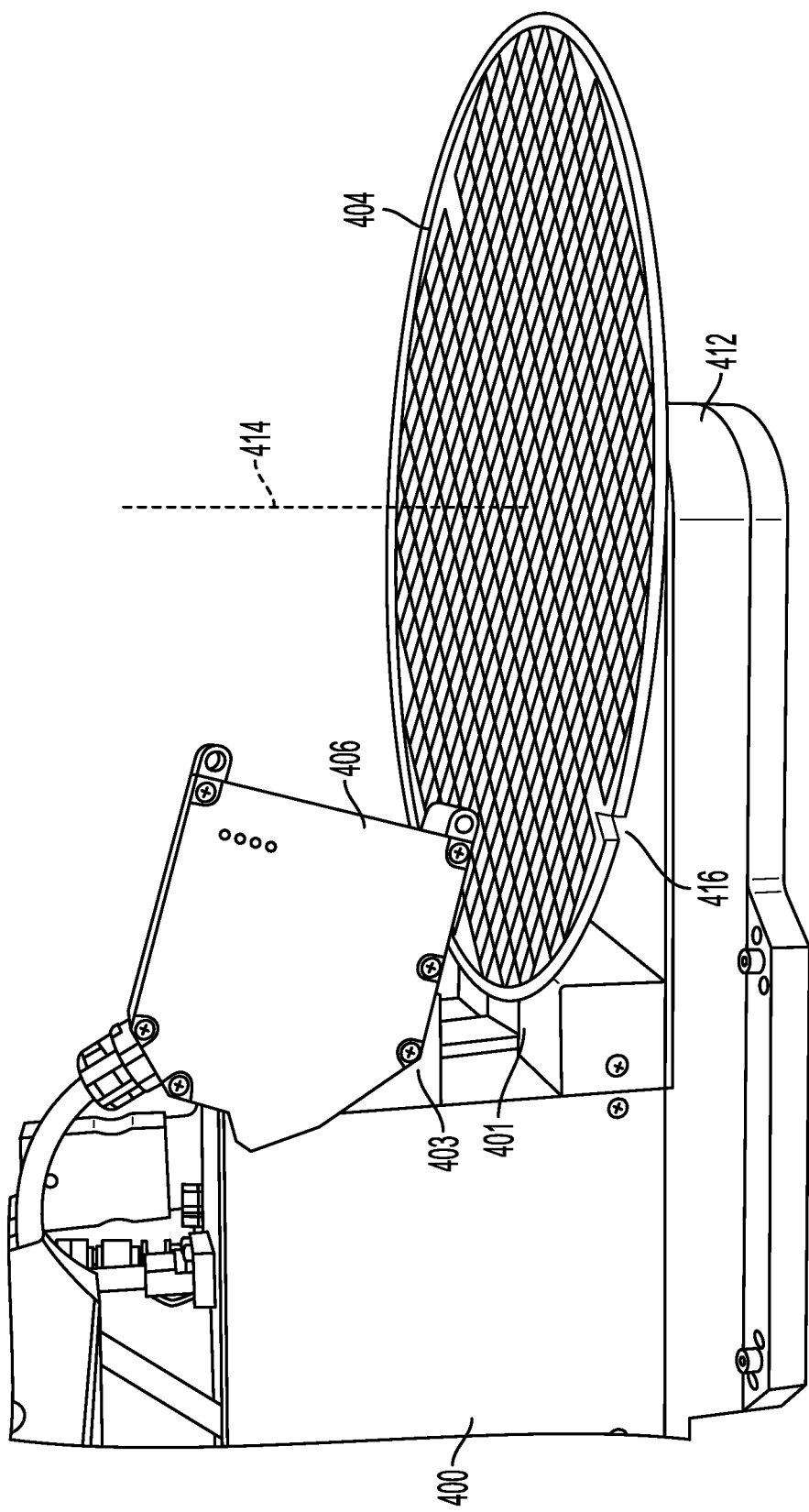
FIG. 4 illustrates a system for measuring wafer displacement, according to some embodiments.

FIG. 4 illustrates a system 400 for measuring wafer displacement, according to some embodiments. The system 400 may include a platform 412 configured to support a wafer 404 and rotate the wafer 404 around a central axis 414 of the wafer 404. For example, before being placed in a CMP machine, an operator or a robotic arm may place the wafer 404 on the platform 412. The platform 412 may then rotate the wafer 404 around the central axis 414. Various sensors may measure attributes of the wafer 404 during rotation.

In some embodiments, the system 400 may include an alignment sensor. The alignment sensor may be implemented using a through-beam sensor that is configured to pass a beam of light between a first component 401 and a second component 403. The alignment sensor may be configured to detect when the beam is interrupted between the first component 401 and the second component 403. The alignment sensor may thus be used in conjunction with the rotation of the wafer 404 provided by the platform 412 to align the wafer 404 to a predefined orientation. For example, the wafer 404 may include a notch 416 or other edge feature along an outer circumference of the wafer 404. Normally, the wafer 404 will block the beam between the first component 401 and the second component 403 as the wafer 404 rotates around the central axis 414. However, when the notch 416 location along the edge of the wafer 404 passes above the first component 401 of the alignment sensor, the beam may be detected by the second component 403, thus indicating the location of the notch 416.

Once the location of the notch 416 is identified in the wafer 404, the system 400 may optionally rotate the wafer 404 to a predetermined orientation. For example, in some cases the system 400 may stop rotation of the wafer 404 when the notch 416 is located. In other cases, the system 400 may continue rotating the wafer 404 until a predetermined angle of rotation is reached. This process performed by the system 400 may be used to ensure that the wafer 404 is rotated to a known orientation before being moved into a subsequent machine in the semiconductor manufacturing process. For example, some systems may use robotic arms to handle the wafer 404 as it moves between various machines. Before being placed on the polishing pad of the CMP machine (or any other semiconductor manufacturing machine), the wafer 404 may be rotated into a known position. As described below, this alignment and rotational orientation of the wafer 404 may also be used to identify locations on the wafer 404 that are bowed or warped.

The system 400 may be implemented at least in part by a machine referred to as an aligner. Specifically, an aligner may be configured to rotate the wafer 404 until the notch 416 is located. In some embodiments, the aligner may be modified to also perform distance or displacement measurements on the wafer 404 as it rotates. The system 400 may further include a displacement sensor 406. As used herein, the term "displacement sensor" may include any sensor configured to measure a distance of a surface from the sensor. Some embodiments may use a laser displacement sensor as an example. A laser displacement sensor may emit one or more laser beams directed at the surface of the wafer 404 and receive reflections from the wafer 404. The displacement sensor 406 may then calculate a distance between the displacement sensor 406 and a surface of the wafer 404 on which the laser beam is directed. As the wafer 404 is rotated around the center axis 414, the displacement sensor 406 may continuously sample a distance measurement relative to the surface of the wafer 404.

When modifying an aligner, the system 400 may also include a computer system that controls and/or records displacement data received from the displacement sensor 406. The computer system may include one or more processors (e.g., microprocessors, microcontrollers, digital controllers, FPGAs, programmable hardware, and/or the like) that are configured to control the operation of the displacement sensor 406 and record displacement data. The one or more processors may be an integrated part of the system 400. Alternatively, the one or more processors may be part of a separate computer system that communicates with the displacement sensor 406 through a wired or wireless interface. Instructions for controlling the displacement sensor 406 may be stored on one or more memory devices, such as a non-transitory computer-readable medium, and these instructions may cause the one or more processors to perform operations such as receiving and processing displacement data, rotating the wafer 404, repackaging the displacement data, and so forth. An example of a computer system is described below in FIG. 11.

The displacement sensor may be positioned to measure a displacement of the wafer 404 as the wafer 404 is rotated. Measuring the displacement of the wafer 404 may generate displacement data. The displacement data may include a distance measurement from the displacement sensor 406 to the wafer 404. Alternatively, the displacement data may include a displacement of the wafer 404 from a baseline location. For example, a baseline location for the wafer 404 may be determined by measuring displacement data for a bare silicon substrate or other wafer that is known to be flat as a reference. If the wafer 404 bows downward such that the displacement measurement is longer than the baseline displacement, the displacement data may include negative values. If the wafer 404 bows upward such that the displacement measure is shorter than the baseline displacement, the displacement data may include corresponding positive values.

The example of FIG. 4 includes a system 400 that combines an aligner and a displacement sensor 406. However, instead of modifying the aligner to include the displacement sensor 406, other systems may omit the aligner and provide a dedicated displacement sensor with a platform that rotates the wafer 400. In other embodiments, the displacement sensor 406 may itself rotate around the central axis 414 while the wafer 404 remains stationary. In these embodiments, the displacement sensor itself may take the place of the aligner and perform the alignment function with the displacement sensor 406. For example, the displacement sensor 406 may collect the displacement data and detect the location of the notch 416.

Figure 5A:
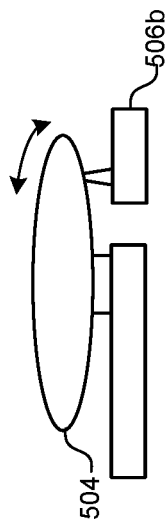
FIG. 5A illustrates a displacement sensor positioned at the edge of the wafer, according to some embodiments.

FIG. 5A illustrates a displacement sensor 506a positioned at the edge of the wafer 504, according to some embodiments. In the example of FIG. 4 above, the displacement sensor 506 may be aimed at an outer edge of the wafer. For example, the outer edge of the wafer may include the outermost 1 cm of the wafer 504 such that the displacement measurement characterizes the displacement along the outer edge of the wafer 504. This position of the displacement sensor 506a may provide specific technical advantages. Specifically, a bow or warping of the wafer 504 may be most pronounced at the edge. Since the wafer 504 is mounted at a center portion of the wafer 504 on the platform, the greatest displacement may be measured along the edge of the wafer 504. Additionally, when aimed at the edge of the wafer, the displacement sensor 506a may also perform the function of the aligner. Specifically, the displacement sensor 506a may continuously sample displacement measurements from the wafer 504. When the notch is encountered in the wafer 504, the displacement measurement may exceed a negative threshold distance, and the displacement sensor 506a may interpret this measurement as the location of the notch. Thus, the displacement sensor 506a may determine the orientation and the displacement data for the wafer 504.

Figure 5B:
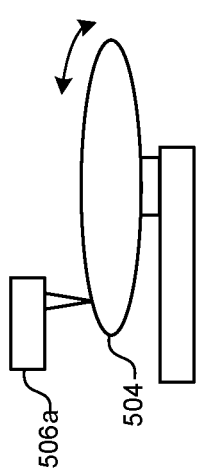
FIG. 5B illustrates a displacement sensor positioned to measure a displacement of the bottom edge of the wafer, according to some embodiments.

FIG. 5B illustrates a displacement sensor 506b positioned to measure a displacement of the bottom edge of the wafer 504, according to some embodiments. Instead of being positioned above the wafer 504 as illustrated in FIG. 5A, the displacement sensor 506b may be placed underneath the wafer 504. This position of the displacement sensor 506b may provide specific technical advantages. Specifically, when a robotic arm is used to move the wafer 504 to/from the system, the displacement sensor 506b positioned below the wafer 504 will typically not interfere with the movement of the wafer 504 by the robotic arm as it lifts the wafer 504. Another technical advantage provided by this arrangement involves the effect of light-emitting displacement sensors on semiconductor devices. Typically, devices on the wafer may be laid out and exposed on the top side of the wafer 504. By placing the displacement sensor 506b underneath the wafer 504, the system can avoid shining lasers or other high-intensity light sources onto these semiconductor devices. This may be advantageous when these semiconductor devices are particularly sensitive to high-intensity light.

Figure 5C:
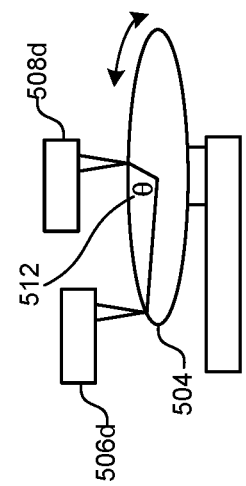
FIG. 5C illustrates a plurality of displacement sensors, according to some embodiments.

FIG. 5C illustrates a plurality of displacement sensors 506c, 508c, according to some embodiments. In this example, a plurality of displacement sensors 506c, 508c may be positioned on a radial line 510 extending out for me center of the wafer 504. This allows the system to measure displacement data at multiple points at each angle of rotation. Although the example of FIG. 5C illustrates two displacement sensors 506c, 508c, this number of displacement sensors is provided only by way of example and is not meant to be limiting. Other embodiments may include more than two displacement sensors. With multiple displacement sensors measuring displacement data along the radial line 510, the system can generate a displacement map of multiple locations on the wafer 504 to create a displacement mapping of the entire surface of the wafer 504 rather than just the edge of the wafer. Prior to this disclosure, a metrology station that performs a laser scan of the entire surface of the wafer 504 was required in order to generate an accurate view of many different aspects of the wafer 504. However, the metrology station is expensive and time-consuming to operate. Providing a plurality of displacement sensors 506c, 508 as depicted in FIG. 5C may replace at least a portion of the operations performed by the metrology station with a low-cost, high-speed process to provide a surface mapping of displacement data for the wafer 504.

Figure 5D:
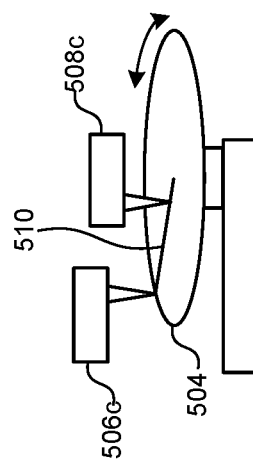
FIG. 5D illustrates a plurality of displacement sensors positioned at different rotational angles, according to some embodiments.

FIG. 5D illustrates a plurality of displacement sensors 506d, 508d positioned at different rotational angles, according to some embodiments. Instead of placing the displacement sensors 506d, 508d along a same radial line at different radial distances, some embodiments may position the displacement sensors 506d, 508d at a same radial distance separated by a known angle of rotation 512. These embodiments may provide duplicate displacement data for a location as a backup in case one of the displacement sensors 506d, 508d fails. These embodiments may also use the duplicate displacement data to characterize, calibrate, and/or detect malfunctions in the displacement sensors 506d, 508d. Note that more than two displacement sensors may also be used without limitation. Another technical advantage provided by aligning multiple displacement sensors 506d, 508d at a same radial distance is the collection of parallel data for the wafer 504. For example, by placing the multiple displacement sensors 506d, 508d approximately 180° apart on the wafer 504, the entire wafer perimeter may be measured in one half rotation rather than a full rotation. Similarly, by placing four displacement sensors approximately 90° apart on the wafer 504, the entire wafer perimeter may be measured in one quarter rotation rather than a full rotation. These configurations can thus reduce the total time required to collect the displacement data by 50%, 25%, etc.

Combinations of the different displacement sensor numbers and/or locations illustrated in FIGS. 5A-5B may be used in any combination and without limitation. For example, some embodiments may include multiple displacement sensors at different angles of rotation and/or different radial distances on a top side of the wafer, while optionally including additional displacement sensors at different angles of rotation and/or different radial distances on a bottom side of the wafer. Some embodiments may also use different sensor types or settings when multiple displacement sensors are used. For example some embodiments may use multiple laser displacement sensors, each operating with a different light frequency. Different frequencies may reflect differently off of the wafer, so using different light frequencies for different sensors may improve the accuracy of the overall displacement data measurement. Additionally, some embodiments may use different sensor types when multiple displacement sensors are used. For example, a laser displacement sensor may be used in one location while an ultrasonic displacement sensor may be used in another location.

Figure 6:
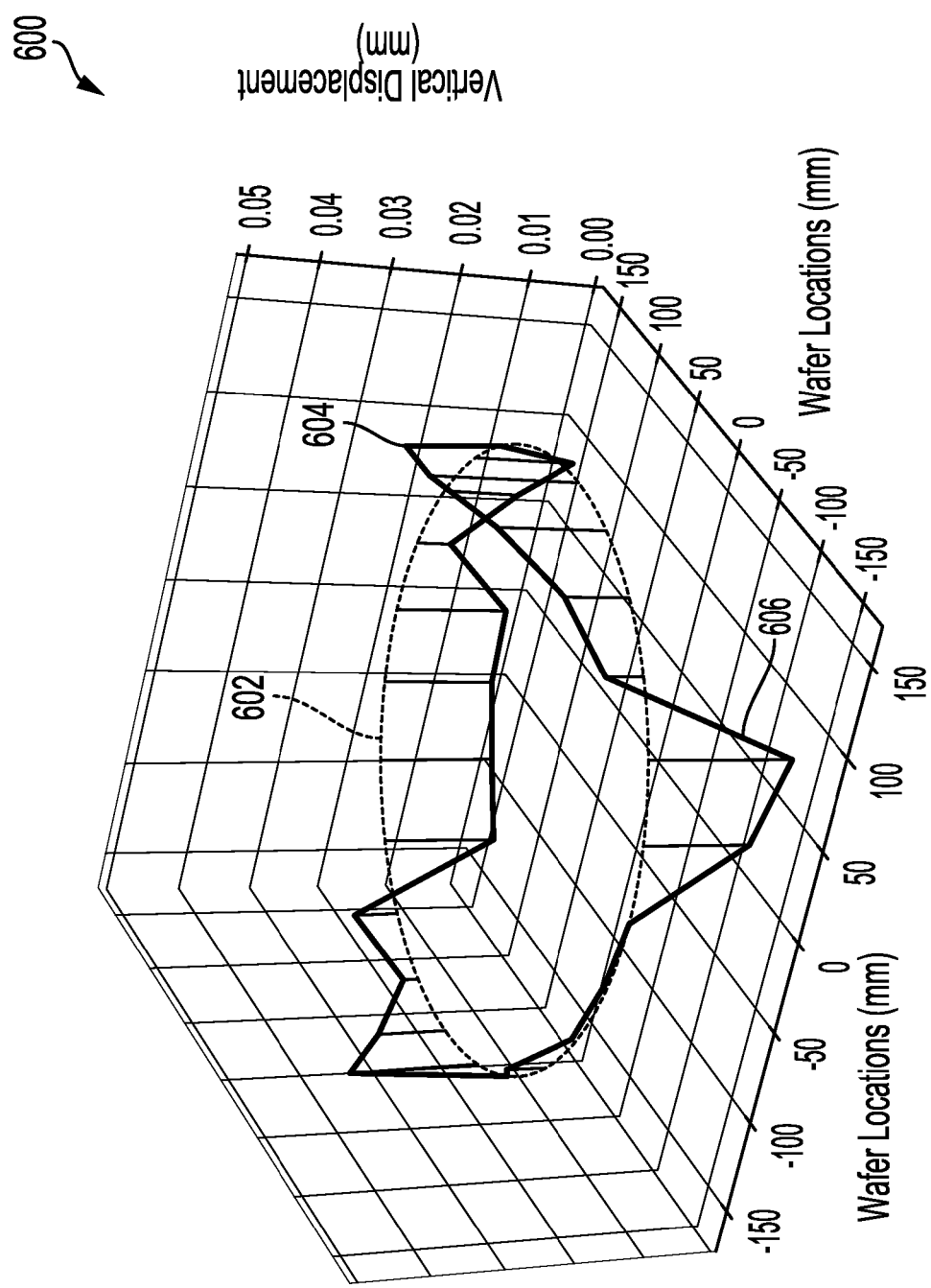
FIG. 6 illustrates a three-dimensional graph of displacement data, according to some embodiments.

FIG. 6 illustrates a three-dimensional (3D) graph 600 of the displacement data, according to some embodiments. The graph 600 includes distance measurements relative to a default or baseline displacement of the wafer. Locations on the wafer may be mapped into Cartesian coordinates on a millimeter scale. These coordinates may be assigned based on the alignment data for the notch. For example, the notch location may be assigned a coordinate position of (0, 150) in the (x, y) plane of the graph 600. Thus, once the alignment position in the displacement data have been captured, some embodiments may rotate the displacement data to conform with the coordinate locations based on the notch location.

In this example, the displacement data is stored as a vertical distance relative to a baseline location. For example, a ring 602 may represent a baseline location of the wafer when no bow or warping is present. The data points 604 representing distances measured above the baseline location may be represented as positive displacements. These data points 604 may correspond to locations on the wafer that have bowed or warped upwards relative to a center of the wafer. Data points 606 representing distances measured below the baseline location may be represented as negative displacements. These data points 606 may correspond to locations on the wafer that have bowed or warped downwards relative to a center of the wafer.

The displacement data may be stored for each wafer as it is rotated on the platform. Additionally, displacement data may be stored for each displacement sensor in the system measuring the wafer. Displacement data from various displacement sensors may be combined for a single wafer to generate a 3D mapping of displacements throughout the surface of the wafer. This displacement data may then be passed to other machines in the semiconductor processing pipeline and used to control operations on those machines as described below.

Figure 7A:
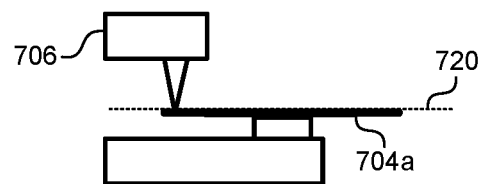
FIG. 7A illustrates a baseline wafer that may be measured by a displacement sensor, according to some embodiments.

FIG. 7A illustrates a baseline wafer 704 that may be measured by a displacement sensor 706, according to some embodiments. The baseline wafer 704 may be an ideal flat wafer in the z-plane. In other words, the baseline wafer 704 may generate a displacement data that shows a constant baseline displacement 720 that aligns with the surface of the wafer 704. The displacement data received from the baseline wafer 704 may be used to characterize the relative displacement of other subsequent wafers that are measured by the system. The baseline wafer 704 may be measured as part of a calibration or initialization process for the system. The displacement data from subsequent measurements of subsequent wafers may be subtracted from the displacement data from the baseline wafer. Although not shown explicitly in FIG. 7A, embodiments that include multiple displacement sensors may store baseline displacement data for each sensor. Displacement data measured from subsequent wafers may be subtracted from the baseline displacement data for each corresponding displacement sensor.

Figure 7B:
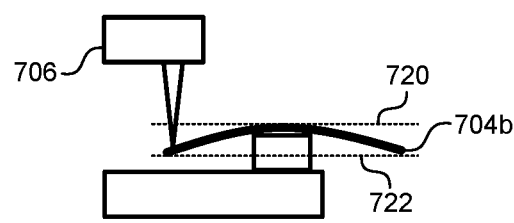
FIG. 7B illustrates a convex wafer, according to some embodiments.
Figure 7C:
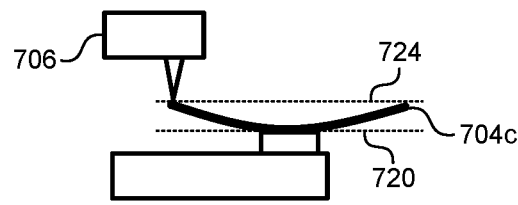
FIG. 7C illustrates a concave wafer, according to some embodiments.

FIG. 7B illustrates a convex wafer 704b, according to some embodiments. A convex profile indicates that the wafer 704b has bowed or warped downwards at the edges of the wafer 704b relative to the center of the wafer. A displacement 722 may be larger than the baseline displacement 720, resulting in negative values for the displacement 722 when subtracted from the baseline displacement 720. Similarly, FIG. 7C illustrates a concave wafer 704c, according to some embodiments. A concave profile indicates that the wafer 704c has bowed or warped upwards at the edge of the wafer 704c relative to the center of the wafer. A displacement 724 may be smaller than the baseline displacement 720, resulting in positive values for the displacement 724 when subtracted from the baseline displacement 720.

Figure 8:
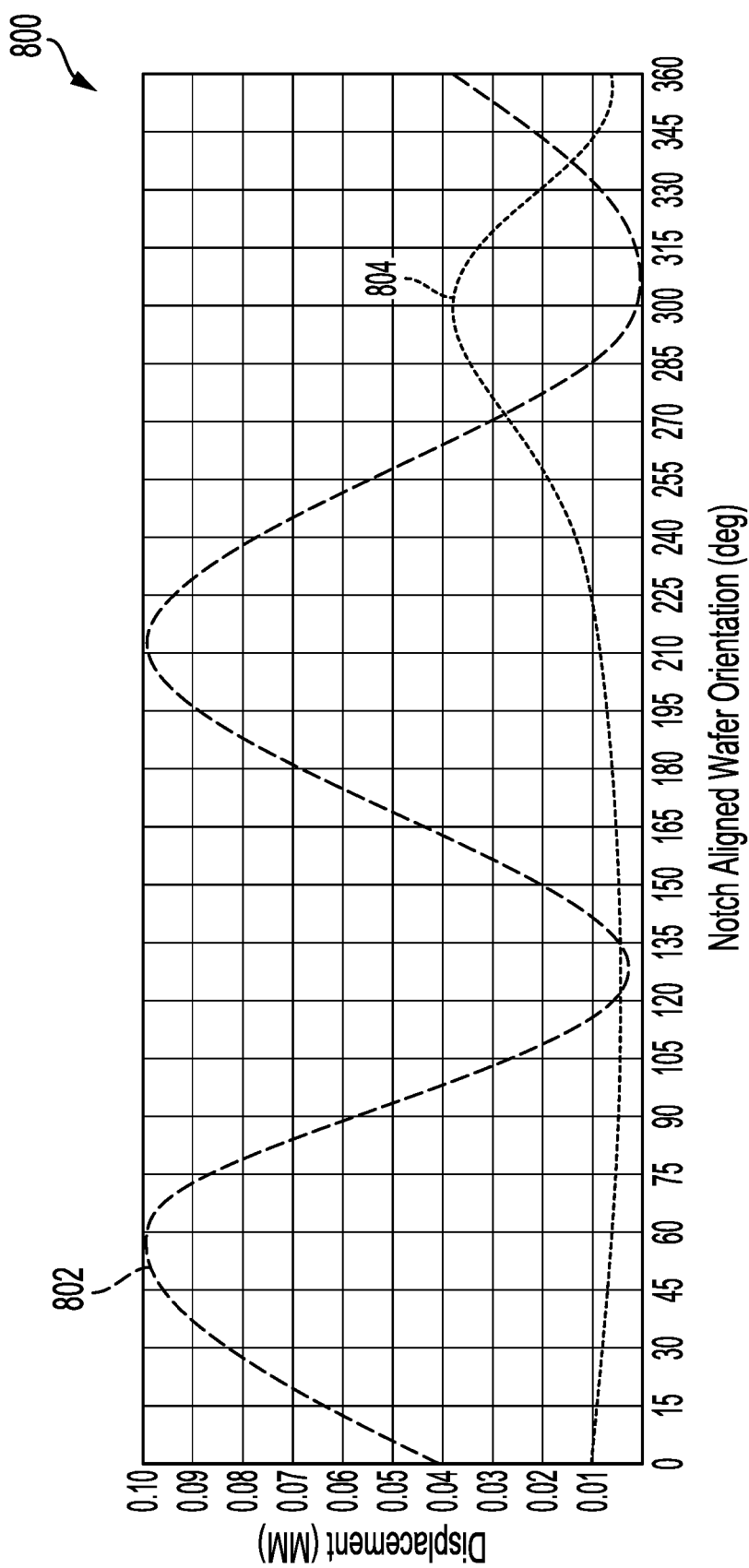
FIG. 8 illustrates a graph of displacement data for warped wafers, according to some embodiments.

FIG. 8 illustrates a graph 800 of displacement data for warped wafers, according to some embodiments. Instead of being mapped to 2D coordinates on a 3D axis, the displacement data may be mapped to a 2D axis, where the x-axis indicates an angle of rotation, and the y-axis indicates a displacement relative to a baseline. The mapping to the angle of rotation may also be based on the alignment data to determine an origin for the rotation. Displacement data 802 corresponds to a wafer that may include concave and/or convex portions. This type of wafer may be characterized as an "potato chip" shape that ripples up and down along the edge of the wafer. Displacement data 804 corresponds to a wafer with one side that curls or warps upwards. Graph 800 illustrates how displacement data for any type of warped or bow condition in wafer may be characterized by the system described herein.

The mapping to the 2D coordinates of FIG. 6, or the mapping to angles rotation in FIG. 8 may be used to control subsequent processes. For example, the 2D coordinates of FIG. 6 may be used to identify 2D regions in the wafer that should be polished more heavily, cleaned more heavily, or be subject to differential pressures during a polishing process. For example, these differential pressures may include lower pressures in some areas and higher pressure in other areas to compensate for irregularities in the wafer as represented in the displacement data. Contiguous areas of displacement on a wafer may be grouped together into a region and mapped to a particular pressurized chamber in the CHIP carrier head. These regions on the wafer may be identified in the mapped data described above.

Figure 9:
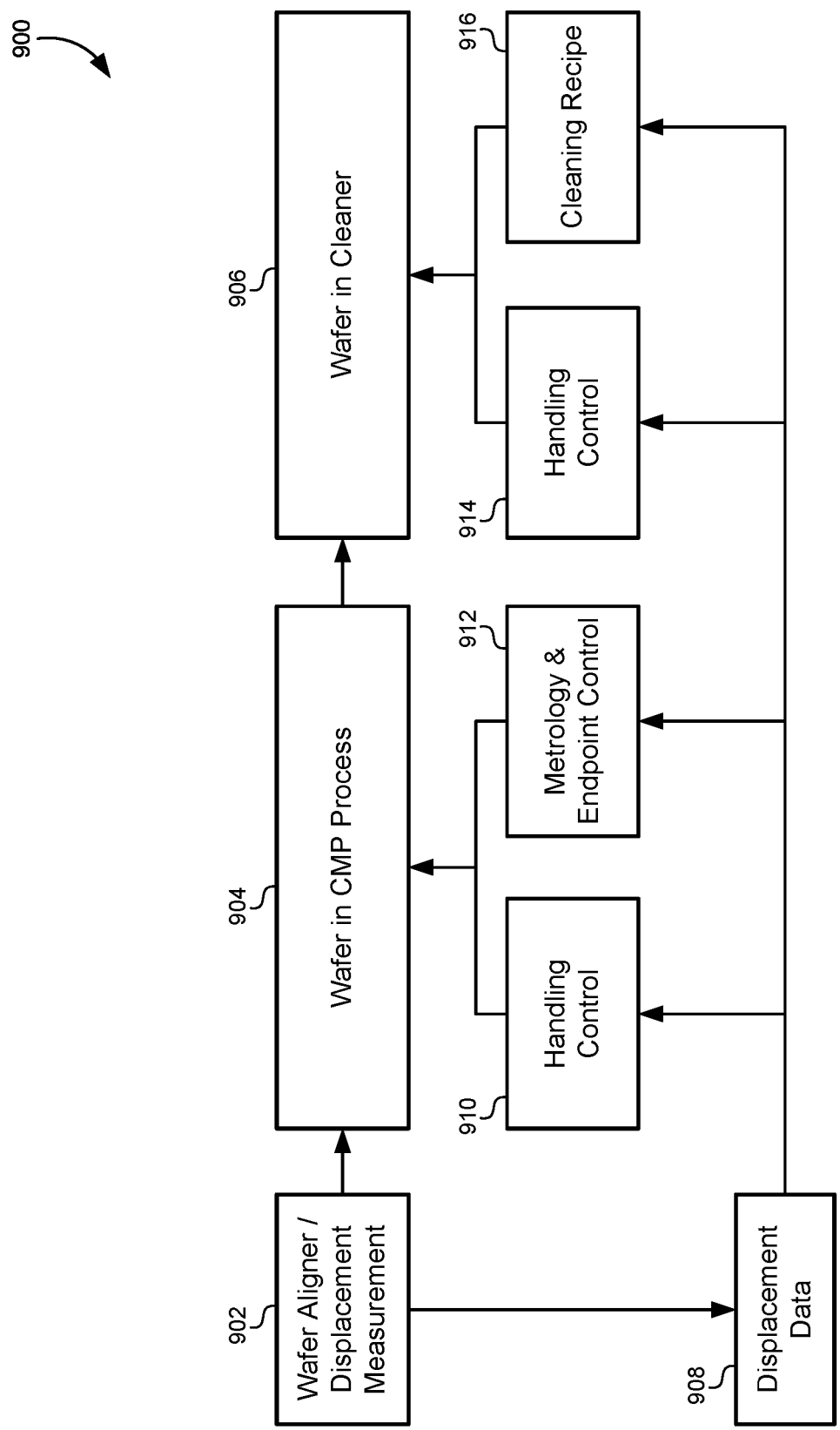
FIG. 9 illustrates a flowchart of different processes the may be executed as part of a semiconductor manufacturing process, according to some embodiments.

FIG. 9 illustrates a flowchart 900 of different processes the may be executed as part of a semiconductor manufacturing process, according to some embodiments. Note that a wafer may have been processed using various semiconductor machines prior to the beginning of the flowchart 900, such as machines that perform various deposition processes, etch processes, and so forth. After these processes have been executed, a robotic arm may move the wafer onto the wafer aligner/displacement measurement system 902. This system 902 may be implemented using the system 400 described above. The wafer aligner/displacement measurement system 902 may generate displacement data 908.

The robotic arm may move the wafer onto a CMP machine 904 to perform a CMP process. The displacement data 908 may be transmitted to a handling control 910 and/or the endpoint control 912 for the CMP machine 904. The displacement data may then be used to control the polishing process performed on the wafer. Specifically, the CMP machine 904 may include a carrier head that grips or holds the wafer. The carrier head may be associated with a number of parameters. These parameters may control an angle at which the wafer is gripped by the carrier head, and/or amount of pressure applied to the wafer at various locations. These parameters may be adjusted on the carrier had to compensate for areas on the wafer that are bowed or warped during the cleaning or polishing processes described below.

For example, the displacement data 908 may be used to control how the handling control 910 grips the wafer. For example, a flat wafer may be gripped with more force by the carrier head than a bowed wafer. The CMP machine may receive the displacement data and adjust the grip force applied to the wafer based on an amount of displacement identified in the displacement data. Additionally, if the wafer bows along a portion of the wafer circumference, the handling control 910 may grip the wafer at a slight angle such that the bowed portion protrudes slightly more than the rest of the wafer away from the carrier head 140 on the CMP machine 100 illustrated in FIG. 1. Additionally, the chambers 146 may be pressurized based on the displacement data 908. Specific chambers 146 that are behind warped portions of the wafer may be pressurized more than other chambers such that they push the warped portions in line with the rest of the wafer or apply greater pressure during the polishing process. This may generate a flat surface on the wafer as it is pushed against the polishing pad in the CMP machine 904. Because the orientation of the wafer is known from the alignment procedure, the displacement data may be mapped to specific chambers 146 in the carrier head 140 that are above the warped portions of the wafer. These chambers may be pressurized more or less based on the positive/negative displacement data associated with each corresponding region of the wafer.

The displacement data 908 may also be used by the endpoint control 912 of the CMP process performed by the CMP machine 904. For example, a real-time thickness of a top layer film on the wafer may be measured as the wafer is polished using the process described above in FIGS. 1-3. For example, a flat wafer may be polished faster and with more force than a bowed or warped wafer. Without access to the displacement data, the polishing process generally uses an average or worst-case polishing speed/pressure to accommodate both flat and warped wafers. However, when the wafer can be characterized as flat or warped using the displacement data, the speed/pressure applied during the polishing process can be adjusted accordingly. The CMP machine may use the displacement data to determine whether the wafer is flat, and if the wafer is flat the CMP machine may then increase the speed/pressure of the polishing process. If the wafer is not flat, then the CMP machine may decrease the speed or pressure of the polishing process. This may lead to a 5%-10% increase in throughput of wafers through the polishing process. The displacement data may also be provided to the CMP machine 904 to allow both flat and warped wafers to be polished to have similar desired post-polishing characteristics. For example, a bowed portion of the wafer may be polished more than the flat portion of the wafer to generate an overall flat surface on the wafer. Some embodiments may also adjust other parameters of the polishing process based on the displacement data. For example, a substantially flat wafer may use a higher temperature or a more abrasive slurry to polish faster, while a warped wafer may use a less abrasive slurry to polish more delicately or vice versa. Additionally, temperatures and chemical additives may be applied to different zones on the wafer at it is being polished. For example, a warped portion of the wafer may use a first chemical additive to the slurry and/or temperature, while a flat portion of the wafer may use a second chemical additive and/or temperature.

The measurement of the reflected wavelengths may be influenced by a displacement of the wafer from the polishing pad. The displacement data 908 may be used to compensate for locations on the wafer that may be bowed or warped and thus may lead to inaccurate thickness measurements of the surface being polished. For example, positive displacement data indicating that the wafer bows towards the polishing pad may add or subtract a proportional amount from a thickness measurement based on the effect of the displacement on the reflected wavelengths received by the spectrometer. Ultimately, in endpoint may be adjusted to polish warped portions of the wafer more than other portions of the wafer to produce an overall flat surface on the wafer for a subsequent step in the semiconductor manufacturing pipeline.

Next, the wafer may be moved to a cleaner 906 or wafer cleaning machine that is configured to clean the wafer from debris left after the polishing process. The displacement data 908 may be passed to the handling control 914 of the cleaner 906 and/or to the software implementing a cleaning recipe 916. The cleaner 906 may include a carrier head similar to the carrier had described above for the CMP machine 904 Next, the displacement data 908 may also be used to control a cleaning process performed on the wafer. For example, the handling control 914 may be altered to grip the wafer differently based on the displacement data such that it is more uniformly oriented for the cleaning process as described above for the polishing process. Additionally, the cleaning recipe 916 may be altered based on the warp/bow profile of the wafer. Portions of the wafer corresponding to a warped region may be cleaned more or less based on relative positive/negative values in the displacement data. For example, a pressure with which a brush is applied to the wafer may be adjusted with the positive/negative displacement data to apply more or less pressure to protruding areas of the wafer in the cleaning machine.

Figure 10:
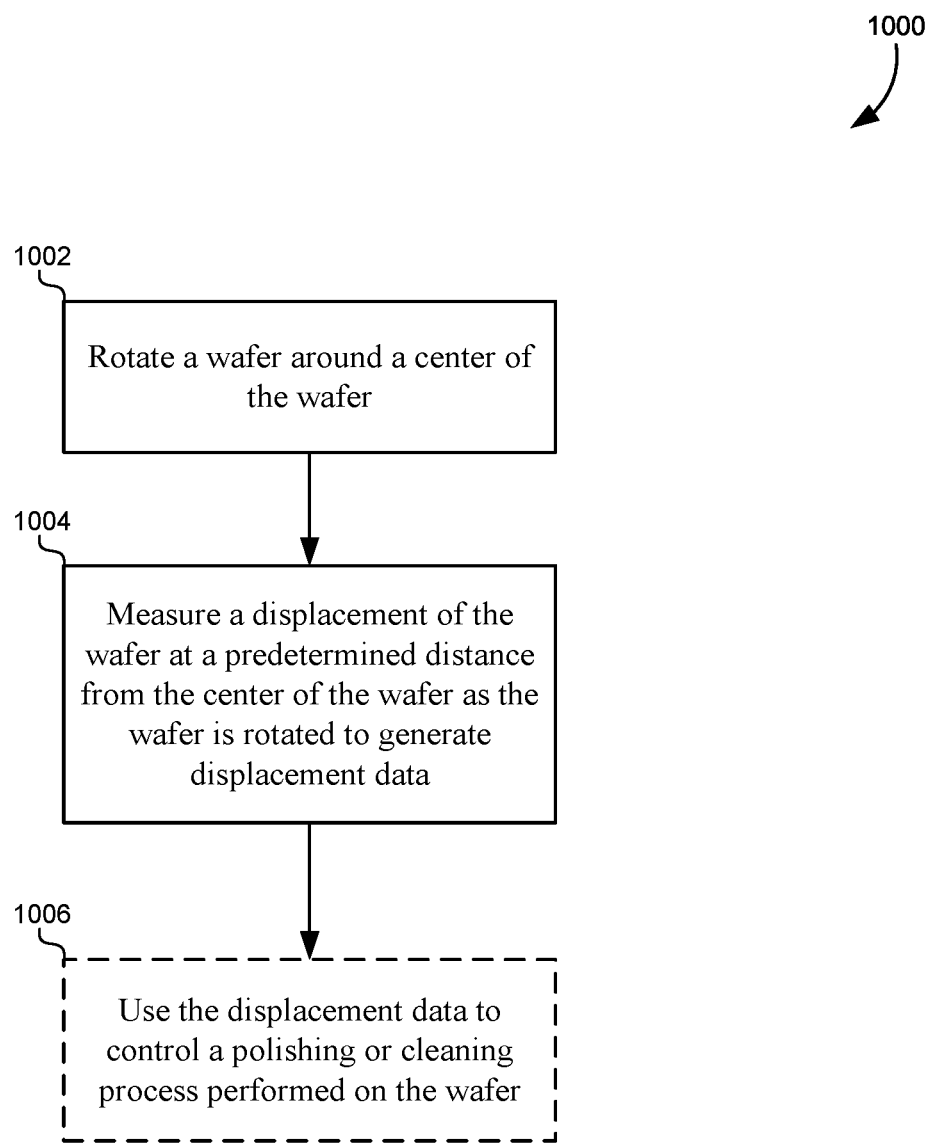
FIG. 10 illustrates a flowchart of a method for measuring displacement of wafers during semiconductor manufacturing processes, according to some embodiments.

FIG. 10 illustrates a flowchart 1000 of a method for measuring displacement of wafers during semiconductor manufacturing processes, according to some embodiments. The method may include rotating a wafer around a center of the wafer (1002). This rotation may be performed as the wafer is supported on a platform as illustrated above in FIG. 4. This rotation may also simultaneously be used to locate and alignment notch on the wafer using an alignment sensor.

The method may further include measuring a displacement of the wafer at a predetermined distance from the center of the wafer as the wafer is rotated to generate displacement data (1004). The predetermined distance may correspond to a position at which the displacement sensor reads displacement data from the wafer. The predetermined distance may be located along an outer edge of the wafer, at any point along a radial line extending from a center of the wafer, and/or at an angle displacement from the alignment sensor or from another displacement sensor as illustrated above in FIGS. 5A-5D. The displacement data may characterize displacement measurements from a plurality of different displacement sensors. The displacement sensor may be implemented using a laser displacement sensor or any other type of displacement sensor configured to measure distances.

The method may additionally include using the displacement data to control a polishing or cleaning process performed on the wafer (1006). This portion of the method may be optional, and some executions of the method may use displacement data to characterize the wafer without using the displacement data to control any other processes. For example, the displacement data may be used to characterize a wafer surface and/or to characterize or test a previous process performed on the wafer. Controlling the polishing process may include using the displacement data to adjust a handling control and/or alter an orientation at which a carrier head secures the wafer. Controlling the polishing process may also include using the displacement data to apply varying amounts of pressure on a backside of the wafer to compensate for bows in the wafer as it is pushed against a polishing pad. Some embodiments may also use the displacement data to control other processes, such as a cleaning process.

The optional step of using the displacement data to control a polishing or cleaning process performed on the wafer may be executed by a computer system of the corresponding polishing machine or cleaning machine. For example, software instructions on the computer system of a polishing machine may cause one or more processors to receive the displacement data generated using the displacement sensor. As described above, the displacement data may indicate at least one area on the wafer that is bowed or warped. These instructions may also cause the machine to identify a parameter of the carrier head corresponding to a location on the area of the wafer that is bowed or warped. The computer system may then adjust that parameter on the carrier head to compensate for the area on the wafer that is bowed or warped. As described above, these parameters may adjust an angle at which a carrier head grips the wafer, may adjust a pressure applied during the polishing process, may adjust an orientation of the wafer during a process, may adjust pressures applied to the back of the wafer using various chambers in the carrier head, and/or the like.

It should be appreciated that the specific steps illustrated in FIG. 10 provide particular methods of measuring displacement of wafers between semiconductor manufacturing processes according to various embodiments. Other sequences of steps may also be performed according to alternative embodiments. For example, alternative embodiments may perform the steps outlined above in a different order. Moreover, the individual steps illustrated in FIG. 10 may include multiple sub-steps that may be performed in various sequences as appropriate to the individual step. Furthermore, additional steps may be added or removed depending on the particular applications. Many variations, modifications, and alternatives also fall within the scope of this disclosure.

Each of the methods described herein may be implemented by a computer system. Each step of these methods may be executed automatically by the computer system, and/or may be provided with inputs/outputs involving a user. For example, a user may provide inputs for each step in a method, and each of these inputs may be in response to a specific output requesting such an input, wherein the output is generated by the computer system. Each input may be received in response to a corresponding requesting output. Furthermore, inputs may be received from a user, from another computer system as a data stream, retrieved from a memory location, retrieved over a network, requested from a web service, and/or the like. Likewise, outputs may be provided to a user, to another computer system as a data stream, saved in a memory location, sent over a network, provided to a web service, and/or the like. In short, each step of the methods described herein may be performed by a computer system, and may involve any number of inputs, outputs, and/or requests to and from the computer system which may or may not involve a user. Those steps not involving a user may be said to be performed automatically by the computer system without human intervention. Therefore, it will be understood in light of this disclosure, that each step of each method described herein may be altered to include an input and output to and from a user, or may be done automatically by a computer system without human intervention where any determinations are made by a processor. Furthermore, some embodiments of each of the methods described herein may be implemented as a set of instructions stored on a tangible, non-transitory storage medium to form a tangible software product.

Figure 11:
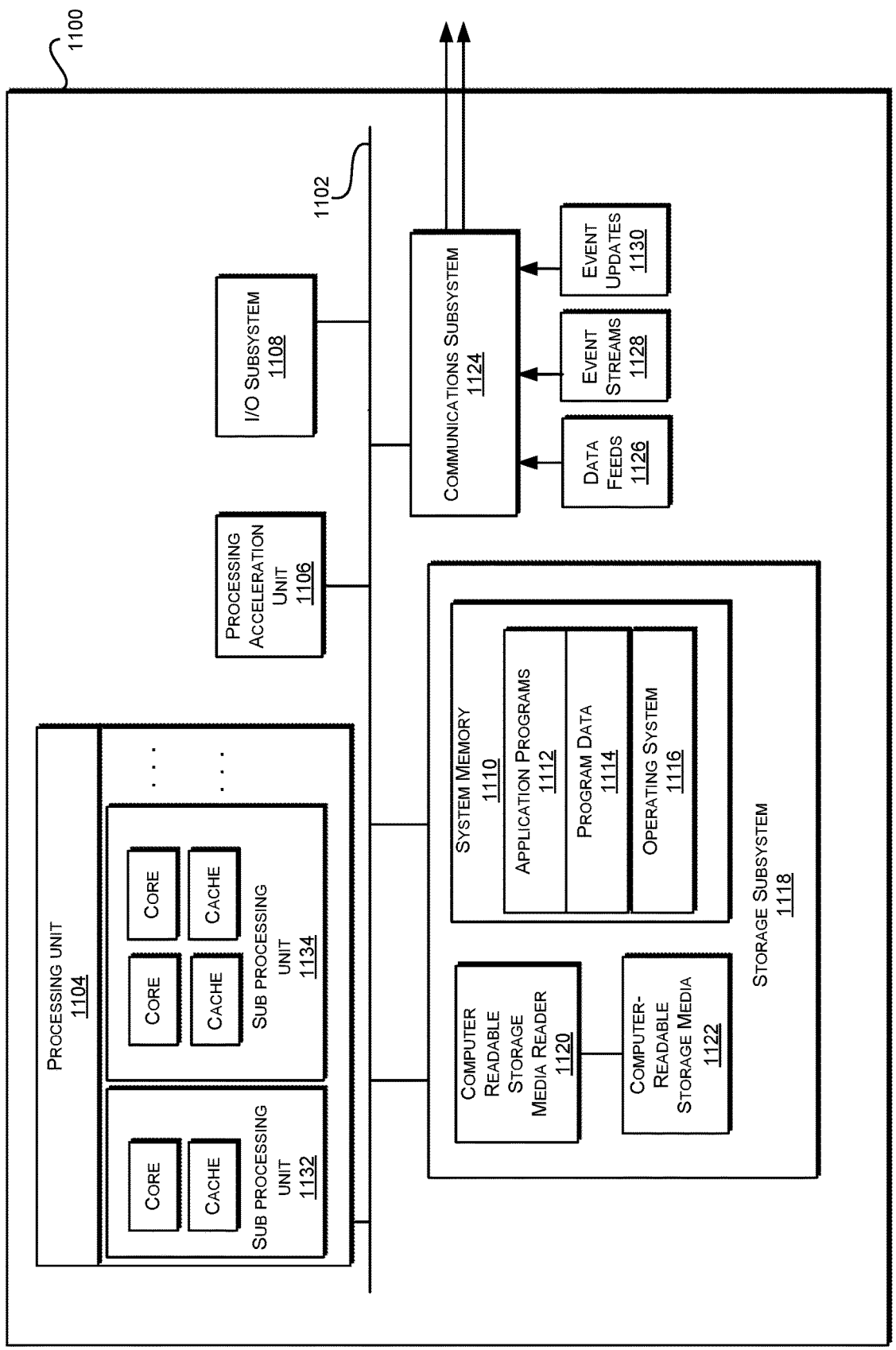
FIG. 11 illustrates an exemplary computer system, in which various embodiments may be implemented.

FIG. 11 illustrates an exemplary computer system 1100, in which various embodiments may be implemented. The computer system 1100 may be used to implement any of the computer systems described above. For example, the computer system 1100 may be used to control the displacement sensor and store the displacement data. The computer system 1100 may also be used to transmit the displacement data to other semiconductor manufacturing machines, such as a CMP machine or a cleaner. The CMP machine and/or the cleaner may also include a computer system 1100 that controls the polishing and/or cleaning process using the displacement data.

As shown in the figure, computer system 1100 includes a processing unit 1104 that communicates with a number of peripheral subsystems via a bus subsystem 1102. These peripheral subsystems may include a processing acceleration unit 1106, an I/O subsystem 1108, a storage subsystem 1118 and a communications subsystem 1124. Storage subsystem 1118 includes tangible computer-readable storage media 1122 and a system memory 1110.

Bus subsystem 1102 provides a mechanism for letting the various components and subsystems of computer system 1100 communicate with each other as intended. Although bus subsystem 1102 is shown schematically as a single bus, alternative embodiments of the bus subsystem may utilize multiple buses. Bus subsystem 1102 may be any of several types of bus structures including a memory bus or memory controller, a peripheral bus, and a local bus using any of a variety of bus architectures. For example, such architectures may include an Industry Standard Architecture (ISA) bus, Micro Channel Architecture (MCA) bus, Enhanced ISA (EISA) bus, Video Electronics Standards Association (VESA) local bus, and Peripheral Component Interconnect (PCI) bus, which can be implemented as a Mezzanine bus manufactured to the IEEE P1386.1 standard.

Processing unit 1104, which can be implemented as one or more integrated circuits (e.g., a conventional microprocessor or microcontroller), controls the operation of computer system 1100. One or more processors may be included in processing unit 1104. These processors may include single core or multicore processors. In certain embodiments, processing unit 1104 may be implemented as one or more independent processing units 1132 and/or 1134 with single or multicore processors included in each processing unit. In other embodiments, processing unit 1104 may also be implemented as a quad-core processing unit formed by integrating two dual-core processors into a single chip.

In various embodiments, processing unit 1104 can execute a variety of programs in response to program code and can maintain multiple concurrently executing programs or processes. At any given time, some or all of the program code to be executed can be resident in processor(s) 1104 and/or in storage subsystem 1118. Through suitable programming, processor(s) 1104 can provide various functionalities described above. Computer system 1100 may additionally include a processing acceleration unit 1106, which can include a digital signal processor (DSP), a special-purpose processor, and/or the like.

I/O subsystem 1108 may include user interface input devices and user interface output devices. User interface input devices may include a keyboard, pointing devices such as a mouse or trackball, a touchpad or touch screen incorporated into a display, a scroll wheel, a click wheel, a dial, a button, a switch, a keypad, audio input devices with voice command recognition systems, microphones, and other types of input devices. User interface input devices may include, for example, motion sensing and/or gesture recognition devices such as the Microsoft Kinect® motion sensor that enables users to control and interact with an input device, such as the Microsoft Xbox® 360 game controller, through a natural user interface using gestures and spoken commands. User interface input devices may also include eye gesture recognition devices such as the Google Glass® blink detector that detects eye activity (e.g., 'blinking' while taking pictures and/or making a menu selection) from users and transforms the eye gestures as input into an input device (e.g., Google Glass®). Additionally, user interface input devices may include voice recognition sensing devices that enable users to interact with voice recognition systems (e.g., Siri® navigator), through voice commands.

User interface input devices may also include, without limitation, three dimensional (3D) mice, joysticks or pointing sticks, gamepads and graphic tablets, and audio/visual devices such as speakers, digital cameras, digital camcorders, portable media players, webcams, image scanners, fingerprint scanners, barcode reader 3D scanners, 3D printers, laser rangefinders, and eye gaze tracking devices. Additionally, user interface input devices may include, for example, medical imaging input devices such as computed tomography, magnetic resonance imaging, position emission tomography, medical ultrasonography devices. User interface input devices may also include, for example, audio input devices such as MIDI keyboards, digital musical instruments and the like.

User interface output devices may include a display subsystem, indicator lights, or non-visual displays such as audio output devices, etc. The display subsystem may be a cathode ray tube (CRT), a flat-panel device, such as that using a liquid crystal display (LCD) or plasma display, a projection device, a touch screen, and the like. In general, use of the term "output device" is intended to include all possible types of devices and mechanisms for outputting information from computer system 1100 to a user or other computer. For example, user interface output devices may include, without limitation, a variety of display devices that visually convey text, graphics and audio/video information such as monitors, printers, speakers, headphones, automotive navigation systems, plotters, voice output devices, and modems.

Computer system 1100 may comprise a storage subsystem 1118 that comprises software elements, shown as being currently located within a system memory 1110. System memory 1110 may store program instructions that are loadable and executable on processing unit 1104, as well as data generated during the execution of these programs.

Depending on the configuration and type of computer system 1100, system memory 1110 may be volatile (such as random access memory (RAM)) and/or non-volatile (such as read-only memory (ROM), flash memory, etc.) The RAM typically contains data and/or program modules that are immediately accessible to and/or presently being operated and executed by processing unit 1104. In some implementations, system memory 1110 may include multiple different types of memory, such as static random access memory (SRAM) or dynamic random access memory (DRAM). In some implementations, a basic input/output system (BIOS), containing the basic routines that help to transfer information between elements within computer system 1100, such as during start-up, may typically be stored in the ROM. By way of example, and not limitation, system memory 1110 also illustrates application programs 1112, which may include client applications, Web browsers, mid-tier applications, relational database management systems (RDBMS), etc., program data 1114, and an operating system 1116. By way of example, operating system 1116 may include various versions of Microsoft Windows®, Apple Macintosh®, and/or Linux operating systems, a variety of commercially-available UNIX® or UNIX-like operating systems (including without limitation the variety of GNU/Linux operating systems, the Google Chrome® OS, and the like) and/or mobile operating systems such as iOS, Windows® Phone, Android® OS, BlackBerry® 10 OS, and Palm® OS operating systems.

Storage subsystem 1118 may also provide a tangible computer-readable storage medium for storing the basic programming and data constructs that provide the functionality of some embodiments. Software (programs, code modules, instructions) that when executed by a processor provide the functionality described above may be stored in storage subsystem 1118. These software modules or instructions may be executed by processing unit 1104. Storage subsystem 1118 may also provide a repository for storing data used in accordance with some embodiments.

Storage subsystem 1100 may also include a computer-readable storage media reader 1120 that can further be connected to computer-readable storage media 1122. Together and, optionally, in combination with system memory 1110, computer-readable storage media 1122 may comprehensively represent remote, local, fixed, and/or removable storage devices plus storage media for temporarily and/or more permanently containing, storing, transmitting, and retrieving computer-readable information.

Computer-readable storage media 1122 containing code, or portions of code, can also include any appropriate media, including storage media and communication media, such as but not limited to, volatile and non-volatile, removable and non-removable media implemented in any method or technology for storage and/or transmission of information. This can include tangible computer-readable storage media such as RAM, ROM, electronically erasable programmable ROM (EEPROM), flash memory or other memory technology, CD-ROM, digital versatile disk (DVD), or other optical storage, magnetic cassettes, magnetic tape, magnetic disk storage or other magnetic storage devices, or other tangible computer readable media. This can also include nontangible computer-readable media, such as data signals, data transmissions, or any other medium which can be used to transmit the desired information and which can be accessed by computing system 1100.

By way of example, computer-readable storage media 1122 may include a hard disk drive that reads from or writes to non-removable, nonvolatile magnetic media, a magnetic disk drive that reads from or writes to a removable, non-volatile magnetic disk, and an optical disk drive that reads from or writes to a removable, nonvolatile optical disk such as a CD ROM, DVD, and Blu-Ray® disk, or other optical media. Computer-readable storage media 1122 may include, but is not limited to, Zip® drives, flash memory cards, universal serial bus (USB) flash drives, secure digital (SD) cards, DVD disks, digital video tape, and the like. Computer-readable storage media 1122 may also include, solid-state drives (SSD) based on non-volatile memory such as flash-memory based SSDs, enterprise flash drives, solid state ROM, and the like, SSDs based on volatile memory such as solid state RAM, dynamic RAM, static RAM, DRAM-based SSDs, magnetoresistive RAM (MRAM) SSDs, and hybrid SSDs that use a combination of DRAM and flash memory based SSDs. The disk drives and their associated computer-readable media may provide non-volatile storage of computer-readable instructions, data structures, program modules, and other data for computer system 1100.

Communications subsystem 1124 provides an interface to other computer systems and networks. Communications subsystem 1124 serves as an interface for receiving data from and transmitting data to other systems from computer system 1100. For example, communications subsystem 1124 may enable computer system 1100 to connect to one or more devices via the Internet. In some embodiments communications subsystem 1124 can include radio frequency (RF) transceiver components for accessing wireless voice and/or data networks (e.g., using cellular telephone technology, advanced data network technology, such as 3G, 4G or EDGE (enhanced data rates for global evolution), WiFi (IEEE 802.11 family standards, or other mobile communication technologies, or any combination thereof), global positioning system (GPS) receiver components, and/or other components. In some embodiments communications subsystem 1124 can provide wired network connectivity (e.g., Ethernet) in addition to or instead of a wireless interface.

In some embodiments, communications subsystem 1124 may also receive input communication in the form of structured and/or unstructured data feeds 1126, event streams 1128, event updates 1130, and the like on behalf of one or more users who may use computer system 1100.

By way of example, communications subsystem 1124 may be configured to receive data feeds 1126 in real-time from users of social networks and/or other communication services such as Twitter® feeds, Facebook® updates, web feeds such as Rich Site Summary (RSS) feeds, and/or real-time updates from one or more third party information sources.

Additionally, communications subsystem 1124 may also be configured to receive data in the form of continuous data streams, which may include event streams 1128 of real-time events and/or event updates 1130, that may be continuous or unbounded in nature with no explicit end. Examples of applications that generate continuous data may include, for example, sensor data applications, financial tickers, network performance measuring tools (e.g. network monitoring and traffic management applications), clickstream analysis tools, automobile traffic monitoring, and the like.

Communications subsystem 1124 may also be configured to output the structured and/or unstructured data feeds 1126, event streams 1128, event updates 1130, and the like to one or more databases that may be in communication with one or more streaming data source computers coupled to computer system 1100.

Computer system 1100 can be one of various types, including a handheld portable device (e.g., an iPhone® cellular phone, an iPad® computing tablet, a PDA), a wearable device (e.g., a Google Glass® head mounted display), a PC, a workstation, a mainframe, a kiosk, a server rack, or any other data processing system.

Due to the ever-changing nature of computers and networks, the description of computer system 1100 depicted in the figure is intended only as a specific example. Many other configurations having more or fewer components than the system depicted in the figure are possible. For example, customized hardware might also be used and/or particular elements might be implemented in hardware, firmware, software (including applets), or a combination. Further, connection to other computing devices, such as network input/output devices, may be employed. Based on the disclosure and teachings provided herein, other ways and/or methods to implement the various embodiments should be apparent.

In the foregoing description, for the purposes of explanation, numerous specific details were set forth in order to provide a thorough understanding of various embodiments. It will be apparent, however, that some embodiments may be practiced without some of these specific details. In other instances, well-known structures and devices are shown in block diagram form.

The foregoing description provides exemplary embodiments only, and is not intended to limit the scope, applicability, or configuration of the disclosure. Rather, the foregoing description of various embodiments will provide an enabling disclosure for implementing at least one embodiment. It should be understood that various changes may be made in the function and arrangement of elements without departing from the spirit and scope of some embodiments as set forth in the appended claims.

Specific details are given in the foregoing description to provide a thorough understanding of the embodiments. However, it will be understood that the embodiments may be practiced without these specific details. For example, circuits, systems, networks, processes, and other components may have been shown as components in block diagram form in order not to obscure the embodiments in unnecessary detail. In other instances, well-known circuits, processes, algorithms, structures, and techniques may have been shown without unnecessary detail in order to avoid obscuring the embodiments.

Also, it is noted that individual embodiments may have been described as a process which is depicted as a flowchart, a flow diagram, a data flow diagram, a structure diagram, or a block diagram. Although a flowchart may have described the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or fixed storage devices, optical storage devices, wireless channels and various other mediums capable of storing, containing, or carrying instruction(s) and/or data. A code segment or machine-executable instructions may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc., may be passed, forwarded, or transmitted via any suitable means including memory sharing, message passing, token passing, network transmission, etc.

Furthermore, embodiments may be implemented by hardware, software, firmware, middleware, microcode, hardware description languages, or any combination thereof. When implemented in software, firmware, middleware or microcode, the program code or code segments to perform the necessary tasks may be stored in a machine readable medium. A processor(s) may perform the necessary tasks.

In the foregoing specification, features are described with reference to specific embodiments thereof, but it should be recognized that not all embodiments are limited thereto. Various features and aspects of some embodiments may be used individually or jointly. Further, embodiments can be utilized in any number of environments and applications beyond those described herein without departing from the broader spirit and scope of the specification. The specification and drawings are, accordingly, to be regarded as illustrative rather than restrictive.

Additionally, for the purposes of illustration, methods were described in a particular order. It should be appreciated that in alternate embodiments, the methods may be performed in a different order than that described. It should also be appreciated that the methods described above may be performed by hardware components or may be embodied in sequences of machine-executable instructions, which may be used to cause a machine, such as a general-purpose or special-purpose processor or logic circuits programmed with the instructions to perform the methods. These machine-executable instructions may be stored on one or more machine readable mediums, such as CD-ROMs or other type of optical disks, floppy diskettes, ROMs, RAMs, EPROMs, EEPROMs, magnetic or optical cards, flash memory, or other types of machine-readable mediums suitable for storing electronic instructions. Alternatively, the methods may be performed by a combination of hardware and software.

What is claimed is:

1. A system comprising:
a platform configured to support a wafer and rotate a wafer around a center of the wafer; and
one or more displacement sensors positioned at a radius that is a predetermined distance from the center of the wafer to measure a displacement of the wafer around the radius as the wafer is rotated.

2. A method of measuring displacement of wafers between semiconductor manufacturing processes, the method comprising:
rotating a wafer around a center of the wafer;
measuring a displacement of the wafer at a radius that is a predetermined distance from the center of the wafer as the wafer is rotated to generate displacement data representing a displacement of the wafer around the radius; and
using the displacement data to control a polishing process or a cleaning process performed on the wafer.

3. The method of claim 2, further comprising:
measuring a displacement of a baseline wafer to generate baseline displacement data representing a flat wafer surface.

4. The method of claim 3, wherein generating the displacement data comprises determining a displacement of the wafer relative to the baseline displacement data.

5. The method of claim 2, further comprising mapping the displacement data to two-dimensional coordinates on the wafer based on alignment data.

6. The method of claim 2, further comprising mapping the displacement data to angles of rotation on the wafer based on alignment data.

7. The method of claim 2, further comprising identifying a displacement area on the wafer in the displacement data, and providing the displacement area to the polishing process or the cleaning process.

8. The method of claim 2, further comprising:
detecting a notch in the wafer using an alignment sensor positioned detect the notch as the wafer is rotated.

9. The method of claim 2, wherein:
the displacement data are collected from one or more displacement sensors.

10. The method of claim 9, wherein the one or more displacement sensors are also positioned to detect a notch in the wafer as the wafer is rotated.

11. The method of claim 9, wherein the one or more displacement sensors comprises a displacement sensor positioned above the wafer.

12. The method of claim 9, wherein the one or more displacement sensors comprises a displacement sensor positioned below the wafer.

13. The method of claim 9, wherein the one or more displacement sensors comprises a plurality of displacement sensors positioned along a radial line of the wafer.

14. The method of claim 9, wherein the one or more displacement sensors comprises a plurality of displacement sensors positioned at different rotational angles around the wafer.

15. The method of claim 2, wherein using the displacement data to control a polishing process or a cleaning process performed on the wafer comprises:
adjusting an angle at which a carrier head grips the wafer during the cleaning process or polishing process.

16. The method of claim 2, wherein using the displacement data to control a polishing process or a cleaning process performed on the wafer comprises:
adjusting an amount of pressure provided against an area on the wafer that is bowed or warped during the cleaning process or polishing process.

17. The method of claim 16, wherein adjusting the amount of pressure comprises:
identifying a chamber in a carrier head that is adjacent to the area on the wafer that is bowed or warped; and
adjusting a pressure in the chamber to compensate for the area on the wafer that is bowed or warped.

18. The method of claim 16, wherein adjusting the amount of pressure comprises:
adjusting a pressure with which a brush cleans the area on the wafer that is bowed or warped during the cleaning process.

* * * * *